United States Patent
Panasik

(10) Patent No.: US 6,548,942 B1
(45) Date of Patent: Apr. 15, 2003

(54) ENCAPSULATED PACKAGING FOR THIN-FILM RESONATORS AND THIN-FILM RESONATOR-BASED FILTERS HAVING A PIEZOELECTRIC RESONATOR BETWEEN TWO ACOUSTIC REFLECTORS

(75) Inventor: Carl M. Panasik, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/571,097

(22) Filed: May 15, 2000

Related U.S. Application Data

(62) Division of application No. 09/022,905, filed on Feb. 12, 1998, now Pat. No. 6,087,198.
(60) Provisional application No. 60/039,577, filed on Feb. 28, 1997.

(51) Int. Cl.⁷ .......................... H01L 41/04; H01L 41/08; H01L 41/18; H02N 2/00
(52) U.S. Cl. ............... 310/364; 310/313 D; 310/313 B; 310/335; 310/340; 310/366
(58) Field of Search .............................. 333/195, 24 R, 333/186, 193, 187; 310/313 D, 313 B, 335, 340, 344, 364, 366; 438/51

(56) References Cited

U.S. PATENT DOCUMENTS

| | | | | |
|---|---|---|---|---|
| 4,223,286 A | * | 9/1980 | Ono et al. ............... | 310/313 A |
| 4,383,194 A | * | 5/1983 | Ohigashi et al. ............ | 310/326 |
| 4,771,205 A | * | 9/1988 | Mequio ....................... | 310/334 |
| 5,422,533 A | * | 6/1995 | Kosinski et al. ............ | 310/311 |
| 5,548,179 A | * | 8/1996 | Kaida .......................... | 310/348 |
| 5,821,833 A | * | 10/1998 | Lakin .......................... | 310/320 |
| 5,867,074 A | * | 2/1999 | Ogiso et al. ................ | 333/193 |
| 5,872,493 A | * | 2/1999 | Ella ............................ | 333/191 |
| 5,873,154 A | * | 2/1999 | Ylilammi et al. ........... | 29/25.35 |
| 5,936,150 A | * | 8/1999 | Kobrin et al. .............. | 73/24.06 |
| 5,939,819 A | * | 8/1999 | Unami et al. ............... | 310/366 |
| 6,054,798 A | * | 4/2000 | Sato et al. .................. | 310/348 |
| 6,097,132 A | * | 8/2000 | Inoi et al. ................... | 310/345 |

FOREIGN PATENT DOCUMENTS

| | | | |
|---|---|---|---|
| JP | 355085121 A | * | 6/1980 |
| JP | 358131810 A | * | 8/1983 |
| JP | 405183370 A | * | 7/1993 |

* cited by examiner

Primary Examiner—Nestor Ramirez
Assistant Examiner—Julio C. Gonzalez
(74) Attorney, Agent, or Firm—Pedro P. Hernandez; W. James Brady, III; Frederick J. Telecky, Jr.

(57) ABSTRACT

An acoustic reflector (48) is applied over a thin-film piezoelectric resonator (41, 61) which is supported on a semiconductor or semiconductor-compatible substrate (42, 62) of a microelectronic device (40, 60), enabling an encapsulant (49) to be applied over the reflector-covered resonator without acoustically damping the resonator. In one embodiment, alternating high and low acoustic impedance layers (51, 53 . . . 55) of one-quarter wavelength thicknesses constructively reflect the resonating wavelength to make an encapsulant in the form of an inexpensive plastic molding compound appear as a "clamping" surface to a resonator (41) peripherally supported over an opening (43) on a silicon substrate (42). In another embodiment, an encapsulant- and reflector-covered resonator (61) is mechanically supported above a second reflector (68) which eliminates the need for peripheral support, making substrate (68) also appear as a clamping surface. The invention enables low cost plastic packaging of resonators and associated circuitry on a single monolithic structure. A radio frequency transceiver front-end application is given as an exemplary implementation.

6 Claims, 2 Drawing Sheets

ENCAPSULATED PACKAGING FOR THIN-FILM RESONATORS AND THIN-FILM RESONATOR-BASED FILTERS HAVING A PIEZOELECTRIC RESONATOR BETWEEN TWO ACOUSTIC REFLECTORS

This application is a division of Ser. No. 09/022,905, filed Feb. 12, 1998, now U.S. Pat. No. 6,087,198 which claims priority under 35 U.S.C. §119(e)(1) of provisional U.S. Ser. No. 60/039,577 filed Feb. 28, 1997, entitled "Low Cost Packaging for Thin-Film Resonators and Thin-Film Resonator-Based Filters," the entirety of which is incorporated herein by reference.

This invention relates generally to microelectronic devices and, in particular, to microelectronic devices including a frequency selective component of the thin-film acoustic resonator type, and to methods of fabricating and packaging the same.

BACKGROUND OF THE INVENTION

Microelectronic devices including frequency selective components are important for many electronic products requiring stable frequency signals or ability to discriminate between signals based on frequency diversity. These functions are difficult to reliably and inexpensively realize together with other circuitry in monolithic form on a silicon substrate.

One approach to providing microelectronic devices with frequency selective functions employs a mass allowed to vibrate in one or more dimensions (e.g., a pendulum). Such a mass is conveniently realized as a thin film supported at critical points, for example, peripherally or alternatively along one edge or end, forming a thin-film resonator structure. The term "thin film" in this context refers to a material deposited using, for example, chemical vapor deposition, evaporation, sputtering or other integrated circuit chip fabrication techniques, and having a thickness in the range of from about a few (2–3) atomic layers to about a few (1–5) microns, with typical thicknesses being about 2–4 microns. Such thin-film structures provide clearly defined mechanical resonances having significant utility, for example as filters in cellular phones and other communications devices or as frequency stabilizing feedback elements in oscillator circuits.

A significant drawback to such suspended mass resonators has been the need to fabricate the free-standing thin-film membrane. Typically, this is done by depositing the thin-film membrane over a sacrificial layer, then selectively removing the sacrificial layer to leave the thin film self-supported. Alternatively, the substrate is etched from the back to provide an opening extending up to the bottom of the membrane. Another approach is to form a cantilevered beam, capacitively coupled to adjacent structures (e.g., by means of a conductor placed beneath the beam). The beam is free to vibrate and has one or more resonance frequencies. Disadvantages of these approaches include the need to form free-standing structures and also a tendency of the beam to "stick" to adjacent structures if or when the beam comes into contact therewith. A need to remove any sacrificial layer and/or underlying substrate material limits fabrication ease and results in structures which are extremely fragile with respect to externally applied forces. These factors contribute to reduced fabrication yields and reduced robustness of the finished resonator component.

Dworsky et al., U.S. Pat. No. 5,373,268, the totality of which is incorporated herein by reference, describes a thin-film resonator having solid mechanical support. In the '268 patent, a piezoelectric element, sandwiched between two electrodes, is supported on an acoustic reflector which presents a high acoustic impedance, analogous to a clamped surface, when situated atop a low acoustic impedance substrate. The reflector has an odd number of alternating layers of high and low acoustic impedance materials of one-quarter wavelength thickness that act to exhibit the transmission line Ferranti effect, whereby the low impedance of the substrate at one end of the reflector transmission line is transformed to a high impedance at the other end closest to the bottom electrode. This enables a one-quarter wavelength thickness resonator to be supported atop the reflector with its bottom electrode effectively "clamped" at the high acoustic impedance end of the reflector. The '268 patent mentions that the same impedance transformation effect can be realized using tapered or other tailored impedance profiles.

Thin-film resonators (and filters based on the use of thin-film resonators) require packaging similar to that used for crystal resonators. In a crystal resonator element, a plate of piezoelectric crystal is suspended inside a hermetic package. Even though both surfaces are metallized, the crystal quality factor and frequency are very sensitive to particulates and changes in humidity. Likewise, thin-film resonators, including those described in the '268 patent which have a reflector structure for mounting on a substrate, require environmental isolation from particulates and humidity. To achieve this isolation, present thin-film resonators must be packaged in high-cost, hermetically sealed metal packages, evacuated or back-filled with inert gas. Inexpensive plastic molding compounds used for packaging integrated circuit dies (viz. compounds with low acoustic impedance and thicknesses greater than one wavelength) are not usable for encapsulating thin-film resonators because they dampen vibration and interfere with acoustic operation. Moreover, to avoid interference with acoustic operation, present-day resonators are not even coated with chemically vapor deposited silicon oxide or silicon nitride, spin-on glass, spin-on polyimide, or similar passivation insulator films (low acoustic impedance and typical thicknesses of 500 to 4,000 Angstroms) deposited as a last line of defense against moisture and other contaminants for integrated circuits.

There is a need for inexpensive microelectronic devices including frequency selective components of the thin-film acoustic resonator type. Thus, there is also a need for low cost environmental isolation and packaging for thin-film resonators and thin-film resonator-based filters.

SUMMARY OF THE INVENTION

The invention provides lower cost environmental isolation and packaging for microelectronic devices including a frequency selective component of the thin-film acoustic resonator type, and lower cost microelectronic devices and electronic systems incorporating the same.

In accordance with one aspect of the invention, an acoustic transformer is applied over a thin-film acoustic resonator which is supported on a semiconductor or semiconductor-compatible substrate of a microelectronic device and an encapsulant is applied over the transformer-resonator structure. The acoustic transformer transforms the low acoustic impedance of the encapsulant into high acoustic impedance at the resonator/transformer interface.

In one embodiment, described in greater detail below, the resonator is a piezoelectric element, sandwiched between upper and lower electrodes, and the acoustic transformer takes the form of an acoustic reflector having alternating layers of high and low acoustic impedance materials. A flowable protective encapsulant material is flowed over the reflector-coupled resonator and cured in place to provide isolation from particulates and humidity. The reflector acts to make the protective encapsulant look like a high impedance to the resonator, with the upper electrode effectively "clamped."

In another embodiment, a similar acoustic transformer and encapsulant are applied to a resonator which is mechanically supported on a substrate by means of a second acoustic reflector below the lower electrode which transforms low acoustic impedance at the substrate into high acoustic impedance at the resonator, effectively clamping the lower electrode, as well.

The invention enables low cost integrated circuit passivation layer and plastic packaging techniques to be applied to thin-film resonators. It also enables thin-film resonators to be usefully fabricated, environmentally isolated and packaged along with semiconductor diodes, transistors and other integrated circuit components in a single monolithic structure.

BRIEF DESCRIPTION OF THE DRAWINGS

Embodiments of the invention have been chosen for purposes of illustration and description, and are shown with reference to the accompanying drawings, wherein.

DETAILED DESCRIPTION OF PREFERRED EMBODIMENTS

Figure 1:
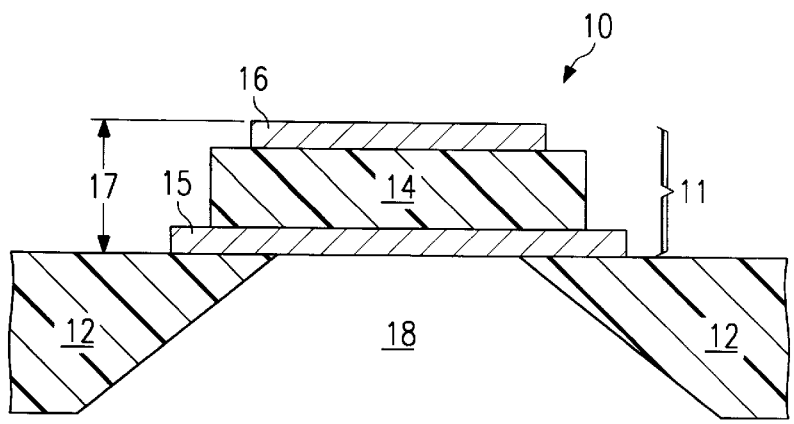
FIGS. 1 and 2 are side sectional views of microelectronic devices including acoustic resonator components in accordance with the prior art.

FIG. 1 shows a microelectronic device 10 including a thin-film acoustic resonator 11 peripherally supported in conventional manner above an opening 18 on a substrate 12. Resonator 11 comprises piezoelectric layer 14 sandwiched between electrode layers 15, 16. Thickness 17 of resonator 11 is typically chosen to be one-half of an acoustic wavelength or an odd multiple thereof. Substrate 12 provides mechanical support for piezoelectric layer 14 and electrodes 15, 16 and for any ancillary components such as transistors, diodes, capacitors, resistors and the like included as part of a larger microelectronic device 10. Substrate 12 conveniently comprises semiconductor (e.g., silicon or germanium) or semiconductor compatible (e.g., silicon on sapphire, cadmium sulfide on glass, etc.) material.

Acoustic impedance $Z_a$ of resonator 10 varies with mass density $\rho$ (rho) and stiffness c as $$Z_a=(\rho * c)^{0.5}, \quad (1)$$

while acoustic velocity $v_a$ varies as $$v_a=(c/\rho)^{0.5}. \quad (2)$$

One component of acoustic reflection coefficient $\Gamma_z$ arises from acoustic impedance mismatch (at an interface between different media, for example) and is found analogously to the familiar impedance mismatch reflection coefficient formula $$\Gamma_z=(Z_t-Z_0)/(Z_0+Z_t), \quad (3)$$

where $Z_t$ represents a terminating impedance and $Z_o$ represents a characteristic impedance of a transmitting medium. A free surface thus corresponds to an extremely low impedance and provides a reflection coefficient of 31 1 while a surface having infinite density and/or stiffness provides a reflection coefficient of +1. A free surface allows particle motion and a high impedance surface "clamps" particle motion. Examples of high impedance terminations thus comprise stiff, dense materials (e.g., tungsten), while low impedance terminations are materials having low stiffness and low mass density (e.g., silicone rubber, air).

Figure 2:
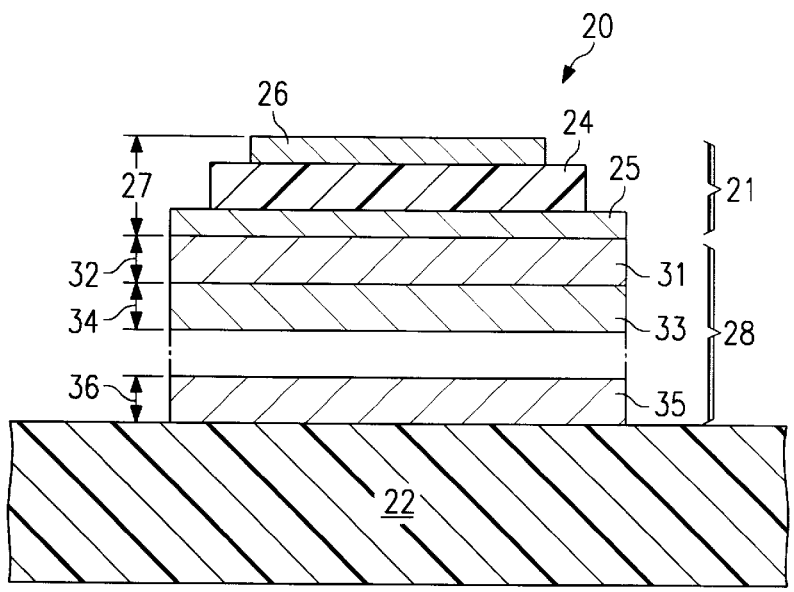

FIG. 2 shows a microelectronic device 20 including an acoustic resonator 21 mounted on a substrate 22 in accordance with U.S. Pat. No. 5,373,268. Resonator 21 comprises electrode layers 25, 26 deposited on either side of piezoelectric layer 24 and has a thickness 27 of one-quarter wavelength. Resonator 21 is disposed atop acoustic reflector 28, which, in turn, is disposed atop substrate 22. Acoustic reflector 28 comprises a plurality of layers of material, represented here as layer 31 having thickness 32, layer 33 having thickness 34 and layer 35 having thickness 36. Further layers disposed between layers 33, 35 are denoted by dot-dashed lines. Layer 35 is disposed on substrate 22, analogous to substrate 12 of device 10 of FIG. 1.

Layers 31, 32 . . . 35 of acoustic reflector 28 are chosen to each have thicknesses 32, 34 . . . 36 equal to one-quarter of a characteristic fundamental acoustic wavelength of the associated resonator and are also chosen to have different acoustic impedances. In a typical embodiment, acoustic reflector 28 comprises alternating layers of high and low acoustic impedance materials (e.g., layer 35 having higher acoustic impedance than substrate 22). Acoustic reflector 28 thus manifests the Ferranti effect, whereby a low impedance (that of substrate 22, for example) at a first end of a transmission line such as acoustic reflector 28 is transformed to a high impedance at a second end (adjacent electrode 25, for example) when acoustic reflector 28 consists of an odd number of layers 31, 33 . . . 35. As discussed in the '268 patent, acoustic reflector 28 may thus be employed to present a high impedance to the piezoelectric resonator, analogous to a clamped surface, when acoustic reflector 28 is situated atop a material (e.g., substrate 22) having a low acoustic impedance and when acoustic reflector 28 comprises an odd number of layers each one-quarter of an acoustic wavelength in thickness.

The effective impedance which acoustic reflector 28 presents increases when the first, third, fifth, etc. layers (e.g., layers 31, 35) have high acoustic impedance and the second, fourth, sixth, etc. layers (e.g., layer 33) have low acoustic impedance. As mentioned in the '268 patent, impedance transformation may also be realized through different techniques, such as tapered impedance media (exponentially/hyperbolically/otherwise tailored impedance profiles may be usefully employed, for example) optimized to provide high impedance or reduced length (thickness) to effect a given impedance transformation. Such variation of composition can be realized, e.g., by sequentially sputtering from a plurality of targets and varying dwell time on each target, or by depositing thin layers of material and varying the number of sequential layers of each material.

In accordance with the '268 patent, when acoustic reflector 28 provides a high acoustic impedance at one end thereof, an acoustic resonator 21 disposed at that one end and comprising electrodes 25, 26 and piezoelectric material 24 may usefully be one-quarter of the characteristic resonating acoustic wavelength in thickness. This is possible because a lower surface of the acoustic resonator is clamped.

Both thin-film resonators (and resonator-based) filters, whether fabricated in accordance with the structures shown in FIG. 1 or FIG. 2, have an upper electrode (16 or 26) that is uncoated (unprotected by a passivation layer) and interfaces with air, so utilize high cost hermetic packaging to provide sealed cavity isolation from adverse effects of humidity and particulates. The high cost of hermetic packaging is a major factor in the high cost of the overall microelectronic device.

Figure 3:
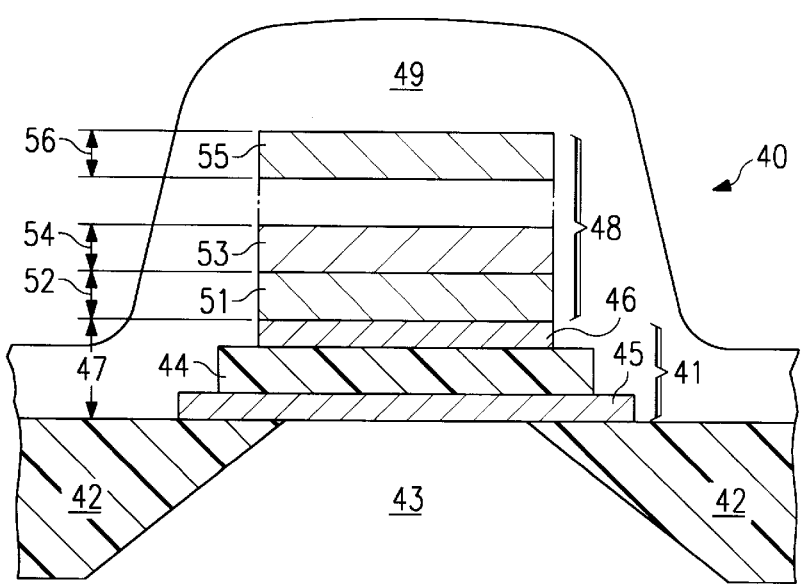
FIGS. 3 and 4 are similar views of microelectronic devices including acoustic resonator components in accordance with the invention.

FIG. 3 shows a microelectronic device 40 including a thin-film acoustic resonator 41 mounted on a substrate 42. Resonator 41 is analogous to resonator 11 (FIG. 1) and comprises electrodes 45, 46 on either side of piezoelectric layer 44. Resonator 44 has a thickness 47 which is one-quarter of an acoustic wavelength in a preferred embodiment. Electrode 45 corresponds to electrode 15 (FIG. 1) and is disposed atop substrate 42, with its edges peripherally supported above an opening formed in the substrate. Electrode 45, piezoelectric element 44 and electrode 46 may, for example, be layers of material successively deposited and patterned using known integrated circuit deposition and patterning techniques. Piezoelectric layer 44 may, for example, comprise a thin layer of piezoelectric (or electrostrictive) material(s) having acceptable electromechanical coupling coefficients, such as AlN, ZnO, CdS and the like. Electrode layers 45, 46 may, for example, be thin layers of metallic materials having low acoustic losses and favorable electrical conductivity properties (e.g., aluminum or aluminum alloys). The substrate opening over which the resonator is clamped may, for example, be formed by etching substrate 42 from the back to give the opening 43 shown in FIG. 3. Alternatively, the opening may be formed by depositing resonator 41 over a sacrificial layer, and then etching away the sacrificial layer. For a 1 GHz frequency resonator fabricated with ZnO, for example, electrode layers 45, 46 may have 0.3 micron thicknesses and layer 44 may be 1 micron thick (one wavelength=6.4 microns).

In accordance with the invention, a laminate acoustic reflector 48 is deposited on top of the upper electrode 46 and a protective molding compound 49 is formed in place over the reflector covered resonator. Reflector 48 comprises a plurality of superposed layers of material, shown here as layer 51 having thickness 52, layer 53 having thickness 54 and layer 55 having thickness 56. Further layers disposed between layers 53, 55 are denoted by dot-dashed lines. Layer 51 is disposed on upper electrode 46. Compound 49 is disposed over layer 55. Layers 51, 52 . . . 55 are chosen to have thicknesses 52, 54 . . . 56 equal to one-quarter of an acoustic wavelength and comprise alternating layers of high and low impedance materials Layers 51, 52 . . . 55 desirably comprise layers of material(s) having low acoustic propagation losses. In a typical embodiment, reflector 48 comprises alternating layers of high and low impedance materials (e.g., layer 55 having higher acoustic impedance than the cured molding compound 49). Acoustic reflector 48 thus acts to transform low impedance at the compound 49 to high impedance at electrode 46, when reflector 48 consists of an odd number of layers, or given other tailored impedance profile to exhibit the similar Ferranti effect.

Reflector 48 is conveniently realized as layers of metal because such an arrangement facilitates contacting electrode 46 and because metal films are conveniently fabricated and patterned in modern microfabrication facilities. Longitudinal acoustic properties of a few representative materials are summarized in U.S. Pat. No. 5,373,268. The resonator is constructed to provide acoustic impedance mismatches at one-quarter wavelength spacings, with reflections occurring in-phase with the incident wave at the mismatches to provide constructive interference at the resonant frequency. There, thus, appears an acoustic mirror above the resonator which enables the encapsulant (viz. passivation layer and/or glob top/overmold material) to be applied directly in contact with the reflector, without damping. The layers are preferably chosen to have matching coefficients of thermal expansion with each other and with the resonator components. In a typical embodiment, the layers will have lateral dimensions on the order of 400 microns across, and thicknesses of about 1–2 microns. The layers can be deposited using standard integrated circuit metallization deposition and patterning techniques.

Electrodes 45, 46 provide electrical connections to the piezoelectric element 44. Metal layer vias or similar known methods are used to provide electrical connections of electrodes 45, 46 to other components formed elsewhere on the same substrate 42. Electrode 45 may, for example, comprise an input electrical port having an associated motional capacitance $C_{m1}$, while electrode 46 may comprise an output electrical port having an associated motional capacitance $C_{m2}$. Motional capacitance $C_m$ is related to static capacitance $C_0$ through the electromechanical coupling coefficient $K^2$, i.e., $C_m/C_0 = 8K^2/\pi^2$.

Compound 49 is preferably an inexpensive plastic molding compound deposited over a spin-on glass passivation layer. The molding compound may be of the type used for encapsulating integrated circuit dies and which is brought into a fluid state, deposited from a reservoir onto the reflector-covered resonator, then cured in place. It may, for example, be an epoxy novalac-based resin or other epoxy, polyimide or silicone resin deposited using a reactive polymer processing technique. Reactive polymer processing is the combined polymerization and processing of reactive polymers or prepolymers in a single operation, and encompasses numerous processing methods such as transfer molding (viz. compressing heated preform in a mold cavity), conformal spread coating (viz. spinning, spraying, vapor deposition), radial-spread (or "glob top") coating (viz. dispensing glob of material from hollow needle), and reaction-injection molding (combining two-part reactive polymers into a mold cavity). Further details of reactive polymer processing methods are found in Chapter 8 of R. Tummala & E. Rymaszewski, Microelectronics Packaging Handbook (1989 Von Nostrand Reinhold), which is incorporated herein by reference.

Figure 4:
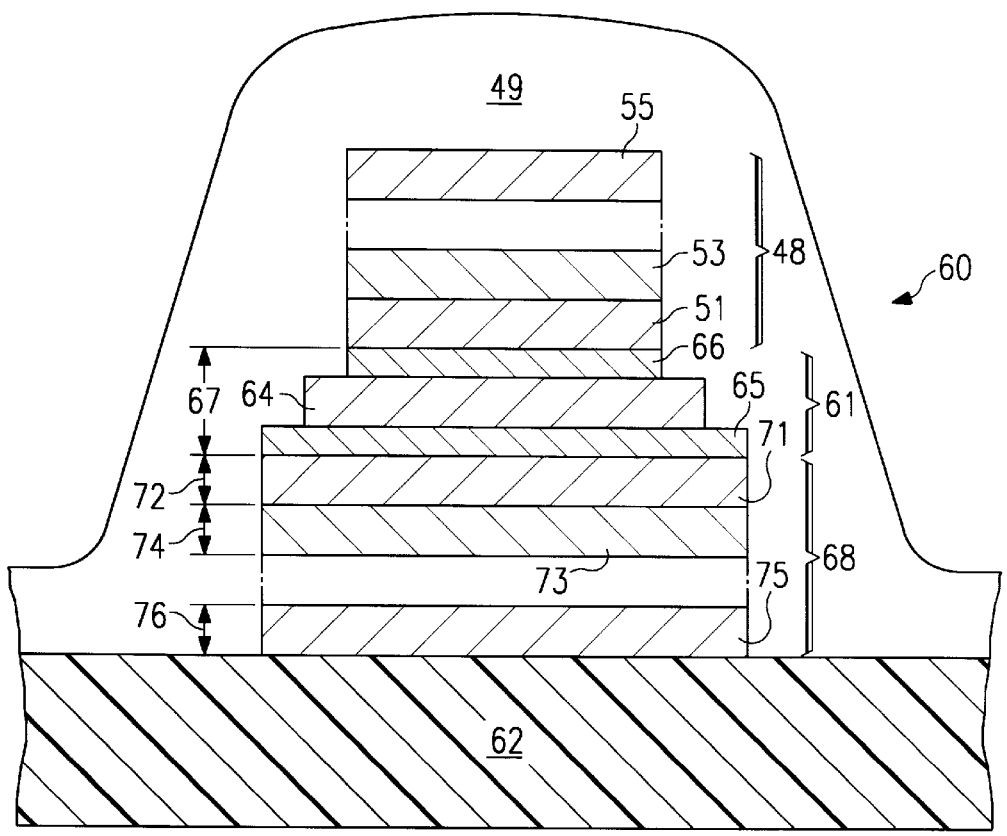

FIG. 4 shows a microelectronic device 60 including a thin-film acoustic resonator 61 mounted on a substrate 62 according to another embodiment of the invention. Resonator 61 is analogous to resonator 21 (FIG. 2) and comprises electrodes 65, 66 on either side of piezoelectric layer 64. Like resonator 11, resonator 61 has a thickness 67 which is one-half wavelength in a preferred embodiment. Electrode 65 corresponds to electrode 25 (FIG. 2) and is disposed atop an acoustic reflector 68 which is analogous to, and may have the same structure as, reflector 28 of FIG. 2. Reflector 68 is, in turn, disposed atop substrate 62. Reflector 68 comprises an odd number of layers 71, 73 . . . 75 of quarter-wavelength thicknesses 72, 74 . . . 76 of alternating high and low acoustic material, dimensioned and configured to transform a low impedance at substrate 62 into a high impedance at electrode 65. An acoustic reflector 48, like that described previously in reference to FIG. 3, is deposited on top of the upper electrode 46 and a protective molding compound 49 is formed in place over the reflector covered resonator. As before, reflector 48 may comprise an odd-numbered plurality of superposed layers 51, 53 . . . 55 of quarter-wavelength thicknesses 52, 54 . . . 56 of alternating high and low impedance materials, dimensioned and configured to transform a low impedance at the cured molding material 49 into a high impedance at the upper electrode 66. As with reflector 48 of FIG. 3, reflector 48 of FIG. 4 provides a mechanism for protecting the upper surface of the resonator from particulates and moisture, while simulating clamping of the upper electrode. This enables the reflector-covered resonator to be encapsulated with passivation layers and epoxy resin or other inexpensive overmold packaging method utilized for packaging integrated circuit semiconductor components. Thus, thin-film resonators and thin-film resonator filters can be incorporated in post-processing on the same substrate with other components, and be adapted to the same packaging procedures that would be used for those components in the absence of incorporation of the resonators or filters.

Figure 5:
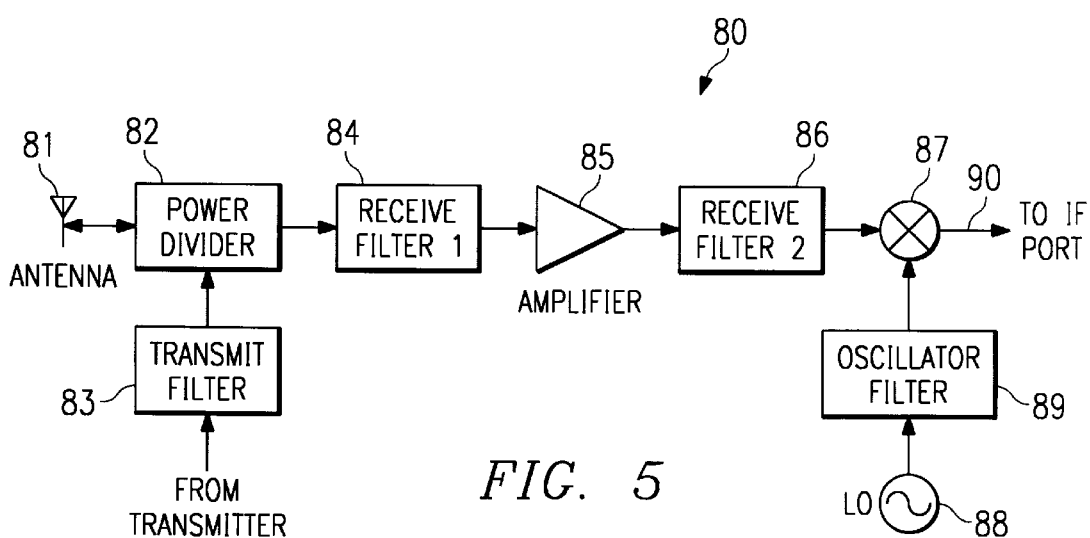
FIG. 5 is a schematic diagram of a radio frequency apparatus including acoustic resonator components in accordance with the invention.

FIG. 5 illustrates an example of a system application of devices 40, 60 or similar devices. Radio frequency receiver front-end circuit 80 comprises an antenna 81 which sends or receives signals from a power divider 82 which is coupled to receive a transmitter signal from a transmit filter 83. Power divider 82 sends an incoming signal to a first receive filter 84 which passes the resulting band limited signal to an amplifier 85. From amplifier 85, the amplified signal passes through a second, band-limiting receive filter 86 to a mixer 87. Mixer 87 also receives a signal from a local oscillator (LO) 88 through a band-limiting oscillator filter 89. The resulting signal from mixer 87 passes to a receiver intermediate frequency (IF) output 90.

Filters 83, 84, 86 and/or 89 are advantageously thin-film resonator filters of the type described here and made according to the structure and method of the present invention, but of varying frequency or other properties according to the particular desired function. For example, filter 84 removes input RF frequencies outside the band in which the receiver is intended to operate. This is particularly useful for narrow band receivers such as are frequently required in cellular phone and paging applications and the like. Additionally, local oscillator 88 may employ a thin-film resonator in accordance with the present invention for a frequency stabilizing element. Filter 86 may have the same or a different pass band than filter 84 and removes any undesired harmonics generated by amplifier 85 or other out-of-band signals not removed by filter 84. Filter 89 desirably passes the local oscillator frequency and stops undesired harmonics thereof.

Thus, electronic apparatus, and especially radio frequency circuitry can benefit from the packaging cost savings which result from the use of microelectronic devices including thin-film resonator filters in accordance with the present invention. The invention enables the practical formation of packaged microelectronic devices including deposited resonator filters for applications such as cellular phones, direct broadcast satellite, television set-top boxes, laptop computer transceivers, etc.

Those skilled in the art to which the invention relates will appreciate that additions, substitutions and modifications can be made to the described embodiments, without departing from the spirit and scope of the invention as described by the claims below.

What is claimed is:

1. A microelectronic device, comprising:

a substrate, and the substrate comprises silicon;

a piezoelectric resonator disposed on the substrate, the piezoelectric resonator comprises a first electrode layer of metal deposited on the silicon, a layer of piezoelectric material deposited over the first electrode layer, and a second electrode layer of metal deposited over the piezoelectric material layer;

an acoustic reflector located over and coupled to the piezoelectric resonator;

an encapsulant comprising a molding compound having a low acoustic impedance, the encapsulant deposited over and encapsulating the piezoelectric resonator and acoustic reflector, the encapsulant making contact with the acoustic reflector;

the acoustic reflector transforms the low acoustic impedance of the encapsulant into a high acoustic impedance at the acoustic resonator/acoustic reflector interface; and wherein the acoustic reflector comprises alternating acoustic reflecting layers of first and second acoustic impedance materials deposited over the second electrode layer of metal; the first acoustic impedance being higher than the second acoustic impedance.

2. The device of claim 1, wherein the acoustic resonator has a given resonant frequency; and wherein the reflecting layers have thicknesses that cause acoustic impedance mismatches with reflections occurring in-phase with the incident waves that occur at the mismatches to provide constructive interference at the resonant frequency.

3. The device of claim 2, wherein the reflecting layers have thicknessses of one-quarter of the resonating wavelength.

4. The device of claim 1, wherein the encapsulant is an encapsulating compound conformally cured in place over the acoustic reflector and piezoelectric resonator.

5. The device of claim 4, wherein the encapsulant comprises an epoxy, polyimide or silicone resin.

6. The device of claim 5, wherein the encapsulant comprises an epoxy novalac-based resin.

* * * * *